United States Patent [19]
Wang et al.

[11] Patent Number: 6,031,402
[45] Date of Patent: *Feb. 29, 2000

[54] CLOCK SYNCHRONIZING CIRCUIT WITH POWER SAVE MODE

[75] Inventors: Sung Ho Wang; Young-Hyun Jun, both of Seoul, Rep. of Korea

[73] Assignee: LG Semicon Co., Ltd., Cheongju, Rep. of Korea

[*] Notice: Under 35 U.S.C. 154(b), the term of this patent shall be extended for 03 days.

[21] Appl. No.: 08/974,382

[22] Filed: Nov. 19, 1997

[30] Foreign Application Priority Data

May 6, 1997 [KR] Rep. of Korea ............... 17318/97

[51] Int. Cl.[7] .................................................. H03L 7/06
[52] U.S. Cl. .................. 327/157; 327/148; 327/161; 375/374; 375/375
[58] Field of Search .................................. 327/147, 148, 327/156, 157, 244, 243, 141, 144, 146, 155, 161; 331/11, 12, DIG. 2; 375/373–376

[56] References Cited

U.S. PATENT DOCUMENTS

| | | | |
|---|---|---|---|
| 4,392,066 | 7/1983 | Hirao | 327/206 |
| 4,893,319 | 1/1990 | Ziuchkovski | 375/362 |
| 4,982,110 | 1/1991 | Yokogawa et al. | 369/48 |
| 5,235,422 | 8/1993 | Ido et al. | 348/537 |
| 5,614,855 | 3/1997 | Lee et al. | 327/158 |
| 5,789,947 | 8/1998 | Sato | 327/3 |

*Primary Examiner*—Kenneth B. Wells
*Assistant Examiner*—Minh Nguyen
*Attorney, Agent, or Firm*—Fleshner & Kim

[57] ABSTRACT

A clock synchronizing circuit provides reduced power consumption. A first phase comparator compares an external clock signal delayed for a predetermined time with a feedback clock signal to detect their phase error, and a second phase comparator compares an external clock signal with a feedback clock signal delayed for a predetermined time to detect their phase error. A charge pump changes a charge amount depending on phase error detecting signals from the first and second phase error comparators, and a phase compensator compensates the phase of the external clock signal depending on the charge amount from the charge pump. A controller controls the overall system or some portion thereof to be converted to a power save mode if the phase of the external clock signal is synchronized with that of the feedback clock signal by the phase compensator.

13 Claims, 5 Drawing Sheets

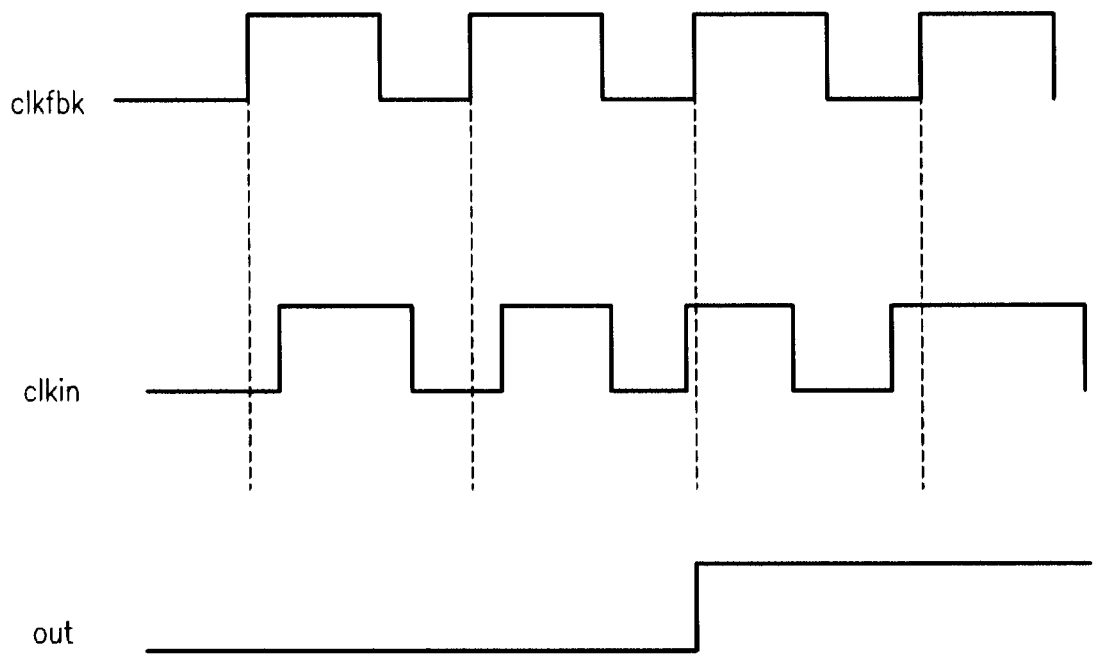

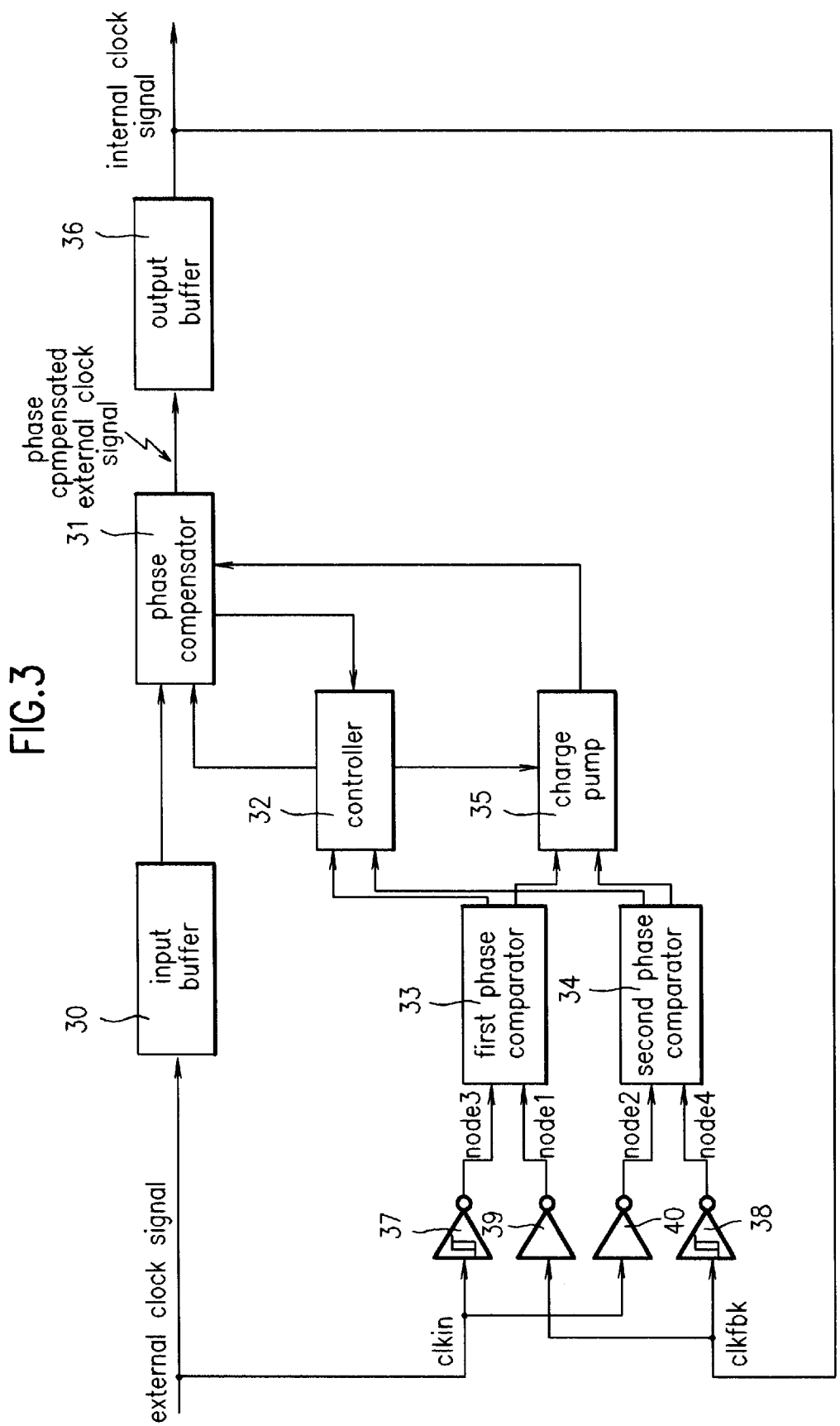

FIG.4B

| out1 | out2 | result |
|------|------|--------|
| 1 | 1 | fast |
| 0 | 0 | slow |
| 0 | 1 | synchronized |
| 1 | 0 | no change |

CLOCK SYNCHRONIZING CIRCUIT WITH POWER SAVE MODE

BACKGROUND OF THE INVENTION

1. Field of the Invention

The present invention relates to a clock synchronizing circuit and, more particularly, to a clock synchronizing circuit capable of reducing power consumption.

2. Background of the Related Art

FIG. 1 is a schematic block of a related clock synchronizing circuit. As illustrated in FIG. 1, the related clock synchronizing circuit includes a phase comparator 5, a charge pump 6, a phase compensator 2, and a controller 4.

The phase comparator 5 compares an external clock input signal with an internal clock signal which is obtained by phase-compensating the external clock signal, and a phase error detecting signal (fast or slow). The charge pump 6 is selectively charged or discharged depending on the phase error detecting signal of the phase comparator 5, and outputs a charge signal for phase error compensation. The phase compensator 2 compensates the phase error of the external clock signal input through an input buffer 1 using the charge signal from the charge pump 6. The phase-compensated external clock signal is received by output buffer 3, which converts the phase-compensated external clock signal to an internal clock signal. The controller 4 controls the phase comparators, the charge pump 6 and the phase comparator.

The phase comparator 5 compares the phase of the external clock signal with the phase of a feedback clock signal derived from the internal clock signal. The phase comparator 5 outputs a high signal if the phase of the external clock signal is faster than the phase of the feedback clock signal. The phase comparator 5 outputs a low signal if the phase of the external clock signal is slower than the phase of the feedback clock signal.

FIG. 2 shows operational waveforms of a related clock phase comparator 5. Referring to FIG. 2, when the external clock signal is low at a time corresponding to a rising edge (RE) of the feedback clock signal, the output of the clock phase comparator 5 becomes low, so that the phase error detecting signal for the input external clock signal becomes slow. When the input external clock input is high at a time corresponding to a RE of the feedback clock signal, the output of the clock phase comparator 5 becomes high, so that the phase error detecting signal for the input external clock signal becomes fast.

As stated above, the related clock synchronizing circuit has several problems. Since the phase comparator 5 of the related clock synchronizing circuit only determines whether the phase of the external clock signal is faster than the phase of the reference clock signal, the phase control system continually compensates the phase of the external clock signal, even when their respective phases are substantially synchronized. This increases unnecessary power consumption. In particular, such unnecessary power consumption is caused during a standby state.

The above references are incorporated by reference herein where appropriate for appropriate teachings of additional or alternative details, features and/or technical background.

SUMMARY OF THE INVENTION

Accordingly, the present invention is directed to a clock synchronizing circuit that substantially obviates one or more of the problems in the related art.

An object of the present invention is to provide a clock synchronizing circuit capable of reducing power consumption.

To achieve these and other advantages, and in accordance with the purpose of the present invention as embodied and broadly described, a clock synchronizing circuit according to the present invention includes a first phase comparator for comparing an external clock signal, which is delayed for a predetermined time, with a feedback clock signal to detect a first phase error and generate a first phase error detecting signal, a second phase comparator for comparing an external clock signal with a feedback clock signal, which is delayed for a predetermined time, to detect a second phase error and generate a second phase error detecting signal, a charge pump for generating a charge and adjusting a magnitude of the charge in accordance with phase error detecting signals from the first and second phase error comparators, a phase compensator for compensating the phase of an external signal clock in accordance with the magnitude of the charge from the charge pump, and a controller for controlling the clock synchronizing circuit or some portion thereof, and switching the clock synchronizing circuit to a power save mode if the phase of the external clock signal is synchronized with the phase of the feedback clock signal by the phase compensator.

The present invention can be achieved in whole or in part by a clock synchronizing circuit comprising: (1) a phase comparator circuit that outputs a first phase error detecting signal based on a time-delayed external clock signal and a feedback clock signal, and a second phase error detecting signal based on an external clock signal and a time-delayed feedback clock signal; and (2) a phase compensator circuit that inputs the external clock signal, compensates the phase of the input external clock signal based on the first and second phase error detecting signals, and outputs a phase-compensated external clock signal.

The present invention can also be achieved in whole or in part by a clock synchronizing circuit comprising: (1) a first phase comparator that determines a first phase difference between a time-delayed external clock signal and a feedback clock signal, and outputs a corresponding first phase error detecting signal; (2) a second phase comparator that determines a second phase difference between an external clock signal and a time-delayed feedback clock signal, and outputs a corresponding second phase error detecting signal; and (3) a phase compensator that inputs the external clock signal, compensates the phase of the input external clock signal based on the first and second phase differences, and outputs a phase-compensated external clock signal.

The present invention can also be achieved in whole or in part by a method of synchronizing a clock, comprising: (1) determining a first phase difference between a time-delayed external clock signal and a feedback clock signal; (2) determining a second phase difference between an external clock signal and a time-delayed feedback clock signal; and (3) compensating a phase of the external clock signal based on the first and second phase differences.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 2 shows operational waveforms of a related phase comparator;

FIG. 3 is a schematic block diagram illustrating a clock synchronizing circuit according to the present invention; and FIGS. 4a and 4b show operational waveforms and an operational table, respectively, of a phase comparator according to the present invention.

DETAILED DESCRIPTION OF PREFERRED EMBODIMENTS

Figure 1:
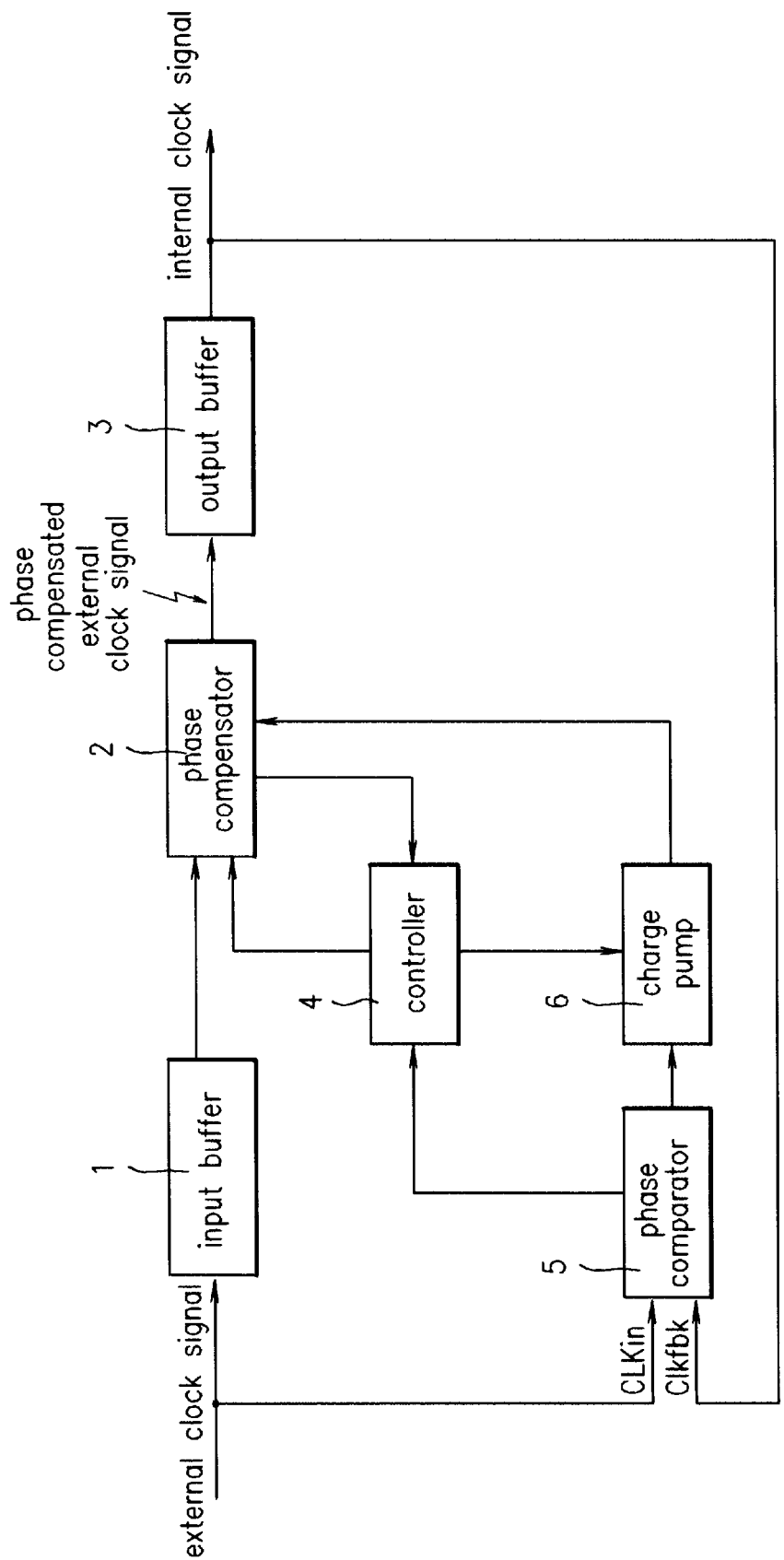
FIG. 1 is a schematic block diagram illustrating a related clock synchronizing circuit.

Reference will now be made in detail to the preferred embodiments of the present invention, examples of which are illustrated in the accompanying drawings.

As illustrated in FIG. 3, the clock synchronizing circuit of the present invention includes a first schmitt trigger 37, a second schmitt trigger 38, a first inverter 39, a second inverter 40, a first phase comparator 33, a second phase comparator 34, a charge pump 35, a phase compensator 31, and a controller 32.

The first schmitt trigger 37 receives an external clock signal clkin from an external clock and outputs a time-delayed external clock signal clkin by schmitt trigger inversion. The second schmitt trigger 38 receives a feedback clock signal clkfbk, which is taken from a phase-compensated internal clock signal, and outputs a time-delayed feedback clock signal clkfbk by schmitt trigger inversion.

The first inverter 39 inverts the feedback clock signal clkfbk from the output buffer 36. The second inverter 40 inverts the external clock signal clkin from the external clock.

The first phase comparator 33 compares the time-delayed external clock signal output by the first schmitt trigger 37 with the inverted feedback clock signal output by the first inverter 39, and outputs a first phase error detecting signal, i.e., a fast phase error signal or a slow phase error signal. The second phase comparator 34 compares the time-delayed feedback clock signal output by the second schmitt trigger 38 with the inverted external clock signal output by the second inverter 40, and outputs a second phase error detecting signal.

The charge pump 35 is selectively charged or discharged in accordance with the phase error detecting signals from the first and second phase comparators 33 and 34, and outputs a charge for phase error compensation. The phase compensator 31 compensates the phase error of the external clock signal input through an input buffer 30 with the charge signal from the charge pump 35, and outputs the phase-compensated external clock signal to an output buffer 36. The controller 32 controls the above-described components.

The clock signals output by the first and second schmitt triggers 37 and 38 are time-delayed by a delay value t1, which is preferably equal to ½ of an allowable clock jitter value, relative to the clock signals output from the first and second inverters 39 and 40. The first phase comparator 33 receives the time-delayed external clock signal clkin from the first schmitt trigger 37 and the inverted feedback clock signal clkfbk from the first inverter 39. The second phase comparator 34 receives the inverted external clock signal clkin from the second inverter 40 and the time-delayed feedback clock signal clkfbk from the second schmitt trigger 38. In this respect, the outputs from the first phase comparator 33 and the second phase comparator 34 have a symmetrical structure with respect to each other.

Figure 4A:
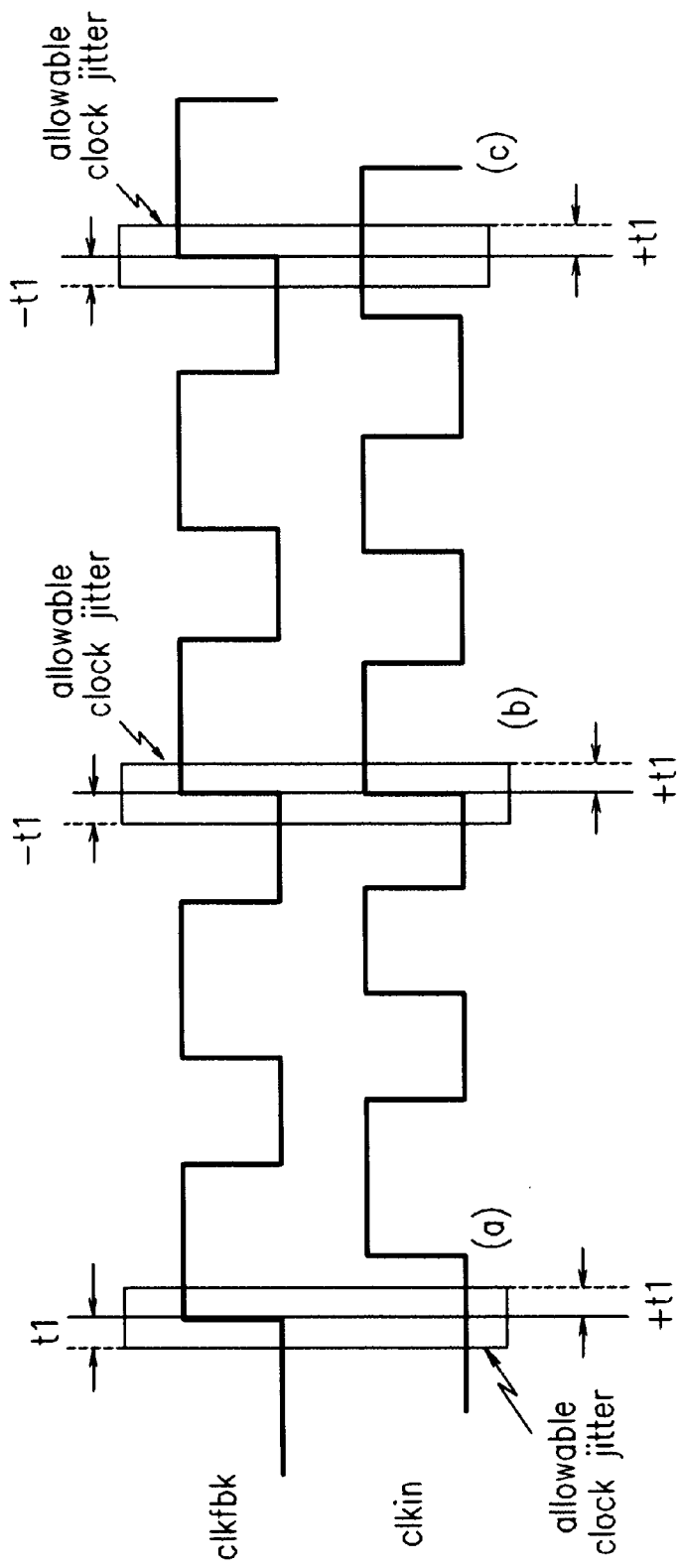

The operation of the clock synchronizing circuit according to the present invention will now be described. In FIG. 4a, the labeling (a) shows a case in which the phase of the external clock signal clkin is slower than the phase of the feedback clock signal. If the delay time imparted by the second schmitt trigger 38 is "t1," the second phase comparator 34 compares the phase of the inverted external clock signal clkin at node 2 with the phase of the feedback clock signal clkfbk at node 4, which has been delayed by t1. If the phase of the inverted external clock signal clkin at node 2 is slower than the phase of the time-delayed feedback clock signal clkfbk at node 4, the output value of the second phase comparator 34 becomes low, as illustrated in the table shown in FIG. 4B. The output value of the first phase comparator 33 is also low because the phase of the external clock signal clkin at node 3, which has been further delayed by t1 by the schrmitt trigger position 37, is slower than the phase of the inverted feedback clock signal clkfbk at node 1.

Furthermore, in FIG. 4a, the labeling (b) shows a case in which the external clock signal clkin and the feedback clock signal clkfbk are synchronized within plus or minus the delay time t1. As discussed above, t1 is preferably equal to ½ of an allowable clock jitter value. Since the phase of the feedback clock signal clkfbk at node 4 is delayed by t1, the phase of the inverted external clock signal clkin at node 2 is faster. Thus, the output of the second phase comparator 34 is high, as shown in FIG. 4B. The output of the first phase comparator 33 is low because the phase of the inverted feedback clock signal clkfbk at node 1 is faster than the phase of the time-delayed external clock signal clkin at node 3. This is due to the delay t1 imparted to the external clock signal clkin by the Schmitt trigger 37.

In FIG. 4a, the labeling (c) shows a case in which the phase of the external clock signal clkin is faster than the phase of the feedback clock signal clkfbk. The first phase comparator 33 compares the phase of the time-delayed external clock signal clkin at node 3, which is delayed by the first schmitt trigger 37, with the phase of the inverted feedback clock signal clkfbk at node 1. If the phase of the time-delayed external clock signal at node 3 is faster than the phase of the inverted feedback clock signal at node 1, the output value of the first phase comparator 33 is high. The output value of the second phase comparator 34 is also high because the phase of the inverted external clock signal clkin at node 2 is faster than the phase of the time-delayed feedback clock signal clkfbk at node 4.

In addition to the above-described cases, the external clock signal and the feedback clock signal may be out of phase by 180°. In this case, the output value of the first phase comparator 33 becomes high and the output value of the second phase comparator 34 becomes low so that the phase of the internal clock signal is not further changed. The output signals of the first and second phase comparators 33 and 34, shown in FIG. 4B, are input to the charge pump 35. The charge pump 35 is selectively charged or discharged, in accordance with the outputs from the first and second phase comparators 33 and 34, thereby changing the amount of charge output by the charge pump 35.

Specifically, if the output signals of the first and second phase comparators 33 and 34 are both high, the phase compensator slows down the phase of the external clock signal, thereby slowing down the phases of the internal clock signal and the feedback clock signal clkfbk. If the output signals of the first and second phase comparators 33 and 34 are both low, the phase compensator 31 speeds up the phase of the external clock signal, thereby speeding up the phases of the internal clock signal and the feedback clock signal clkfbk. If the output signals of the first and second phase comparators 33 and 34 are low and high, respectively, the phase compensator does not change the phase of the external clock signal because it is synchronized with the phases of the internal clock signal and the feedback clock signal.

When the clock synchronizing circuit of the present invention synchronizes the phases of the external clock signal and the internal clock signal, the controller 32 converts the overall system to a power save mode, which disables the overall system or some portion thereof.

As described above, the clock synchronizing circuit of the present invention has the following advantages. When the phases of the external clock signal and internal clock signal are synchronized, the overall system or some portion thereof is disabled, thereby efficiently reducing power consumption of the system.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A clock synchronizing circuit, comprising:

a phase comparator circuit that outputs a first phase error detecting signal based on a time-delayed external clock signal and a feedback clock signal, and a second phase error detecting signal based on a first external clock signal and a time-delayed feedback clock signal;

a phase compensator circuit that inputs the first external clock signal and outputs a second external clock signal, wherein the phase compensator circuit has a first mode of operation, in which the phase compensator circuit phase-compensates the first external clock signal to generate the second external clock signal, and a second mode of operation, in which the phase compensator circuit does not phase-compensate the first external clock signal; and a controller that selects one of the first and second modes of operation based on the first and second phase error detecting signals;

wherein the time-delayed external clock signal and the time-delayed feedback clock signal are generated by a first time-delay circuit and a second time-delay circuit, respectively, and wherein the first and second time-delay circuits comprise a first and second schmitt trigger, respectively.

2. The clock synchronizing circuit of claim 1, wherein the phase comparator circuit comprises:

a first phase comparator that determines a first phase difference between the time-delayed external clock signal and the feedback clock signal, and outputs the first phase error detecting signal; and a second phase comparator that determines a second phase difference between the external clock signal and the time-delayed feedback clock signal, and outputs the second phase error detecting signal.

3. A clock synchronizing circuit, comprising:

a first phase comparator that receives a time-delayed external clock signal and a feedback clock signal, determines a first phase difference between the time-delayed external clock signal and the feedback clock signal, and outputs a corresponding first phase error detecting signal;

a second phase comparator that receives a first external clock signal and a time-delayed feedback clock signal, determines a second phase difference between the first external clock signal and the time-delayed feedback clock signal, and outputs a corresponding second phase error detecting signal;

a phase compensator that inputs the first external clock signal and outputs a second external clock signal, wherein the phase compensator has a first mode of operation, in which the phase compensator phase-compensates the first external clock signal to generate the second external clock signal, and a second mode of operation, in which the phase compensator does not phase-compensate the first external clock signal;

a controller for selecting one of the first and second modes of operation based on the first and second phase error detecting signals;

a first schmitt trigger that receives the first external clock signal and outputs, by schmitt trigger inversion, the time-delayed external clock signal to the first phase comparator;

a first inverter that receives and inverts the feedback clock signal and outputs the inverted feedback clock signal to the first phase comparator;

a second schmitt trigger that receives the feedback clock signal and outputs, by schmitt trigger inversion, the time-delayed feedback clock signal to the second phase comparator; and a second inverter that receives and inverts the first external clock signal and outputs the inverted external clock signal to the second phase comparator.

4. The clock synchronizing circuit as claimed in claim 3, further comprising a charge pump that generates a charge and adjusts a magnitude of the charge in response to the first and second phase error detecting signals, wherein the phase compensator inputs the charge generated by the charge pump and, when the phase compensator is in the first mode of operation, compensates the phase of the first external clock signal in accordance with the magnitude of the charge from the charge pump.

5. The clock synchronizing circuit as claimed in claim 3, further comprising an output buffer that receives the second external clock signal and outputs an internal clock signal.

6. The clock synchronizing circuit as claimed in claim 5, wherein the feedback clock signal comprises a portion of the internal clock signal.

7. The clock synchronizing circuit as claimed in claim 5, wherein the first and second schmitt triggers output respective clock signals that are time-delayed by an amount equal to approximately one-half of a predetermined clock jitter value.

8. The clock synchronizing circuit as claimed in claim 3, wherein the first phase comparator outputs a high level phase error detecting signal if a phase of the time-delayed external clock signal is fast relative to a phase of the feedback clock signal, and outputs a low level phase error detecting signal if the phase of the feedback clock signal is fast relative to the phase of the time-delayed external clock signal.

9. The clock synchronizing circuit as claimed in claim 8, wherein the second phase comparator outputs a high level phase error detecting signal if a phase of the first external clock signal is fast relative to a phase of the time-delayed feedback clock signal, and outputs a low level phase error detecting signal if the phase of the time-delayed feedback clock signal is fast relative to the phase of the first external clock signal.

10. The clock synchronizing circuit as claimed in claim 3, wherein the phase compensator slows down a phase of the first external clock signal when the first and second phase error detecting signals are both at a high level.

11. The clock synchronizing circuit as claimed in claim 3, wherein the phase compensator speeds up a phase of the first external clock signal when the first and second phase error detecting signals are both at a low level.

12. The clock synchronizing circuit as claimed in claim 3, wherein the phase compensator operates in the second mode and does not change a phase of the first external clock signal when the first phase error detecting signal is at a low level and the second phase error detecting signal is at a high level.

13. The clock synchronizing circuit as claimed in claim 3, wherein the phase compensator operates in the second mode and does not change a phase of the first external clock signal when the first phase error detecting signal is at a high level and the second phase error detecting signal is at a low level.

* * * * *